United States Patent [19]

Tanabe et al.

[11] Patent Number: 6,068,000
[45] Date of Patent: May 30, 2000

[54] SUBSTRATE TREATMENT METHOD

[75] Inventors: Masahito Tanabe; Kazumasa Wakiya; Masakazu Kobayashi; Toshimasa Nakayama, all of Kanagawa, Japan

[73] Assignee: Tokyo Ohka Kogyo Co., Ltd., Kanagawa, Japan

[21] Appl. No.: 08/891,137

[22] Filed: Jul. 10, 1997

[30] Foreign Application Priority Data

Jul. 11, 1996 [JP] Japan .................................... 8-199574

[51] Int. Cl.7 ............................. B08B 6/00; H01L 21/302
[52] U.S. Cl. ............................ 134/1.3; 216/41; 438/705; 438/750
[58] Field of Search .............................. 134/1.3; 216/41, 216/90; 438/705, 747, 750

[56] References Cited

U.S. PATENT DOCUMENTS

| 4,165,295 | 8/1979 | Vandermay ............................... 252/143 |
| 4,824,762 | 4/1989 | Kobayashi et al. ...................... 430/258 |
| 5,320,709 | 6/1994 | Bowden et al. ......................... 156/667 |
| 5,376,236 | 12/1994 | Hanson et al. .......................... 156/664 |
| 5,478,436 | 12/1995 | Winebarger et al. ................. 156/636.1 |
| 5,571,447 | 11/1996 | Ward ....................................... 510/206 |
| 5,698,503 | 12/1997 | Ward et al. .............................. 510/176 |
| 5,792,274 | 8/1998 | Tanabe et al. ............................ 134/1.3 |
| 5,795,702 | 8/1998 | Tanabe et al. ........................... 430/331 |

FOREIGN PATENT DOCUMENTS

| 0662705 | 7/1995 | European Pat. Off. . |
| 662705 A2 | 7/1995 | European Pat. Off. . |
| 0680078 | 11/1995 | European Pat. Off. . |
| 0773480 | 5/1997 | European Pat. Off. . |

*Primary Examiner*—Benjamin L. Utech
*Assistant Examiner*—George Goudreau
*Attorney, Agent, or Firm*—Sughrue, Mion, Zinn, Macpeak & Seas, PLLC

[57] ABSTRACT

The present invention provides a substrate treatment method to be performed after the steps of forming a desired resist pattern on a substrate and etching thereof, wherein said method comprises steps of: (I) removing the resist pattern on the substrate using a remover solution principally containing a salt derived from hydrofluoric acid and a metal-free base; (II) rinsing said substrate with a lithographic rinsing solution containing a water-soluble organic solvent and water; and (III) washing said substrate with water. According to the present invention, metallic films on the substrate are not corroded in the substrate treatment method, and the method can be performed at a low cost and with a reduced volume of labor for disposal of waste solution used for washing the substrate.

20 Claims, No Drawings

SUBSTRATE TREATMENT METHOD

BACKGROUND OF THE INVENTION

1. Field of the Invention

The present invention relates to substrate treatment methods. More specifically, the present invention relates to a substrate treatment method which includes a step of etching a patterned resist layer or the like on a substrate of a semiconductor device, a liquid-crystal panel device or the like such as an IC or LSI, a step of removing the resist layer by a remover solution containing hydrofluoric acid and a succeeding rinsing step using a specific rinsing solution for lithography.

2. Description of the Related Art

Hitherto, manufacture of a semiconductor device or a liquid-crystal panel device such as an IC or LSI includes the following process: A photoresist is uniformly applied on a conductive metallic film such as of aluminum, copper or aluminum alloy, and/or an insulating film such as a $SiO_2$ film which have been formed on a substrate; a latent image is drawn on the photoresist by exposure or electron-beam irradiation; the pattern is then developed to form a resist pattern; said conductive metallic film and/or insulating film are selectively etched using the resist pattern as a mask, thereby forming a fine circuit; and the unnecessary resist layer is removed using a remover solution.

Typical examples of remover solutions for removal of such a resist include organic sulfonic acid-based remover solutions containing alkylbenzenesulfonic acid as a principal ingredient, organic amine-based remover solutions containing an organic amine such as monoethanol amine as a principal ingredient, and hydrofluoric acid-based remover solutions containing hydrofluoric acid as a principal ingredient. Organic sulfonic acid-based remover solutions are, however, inferior in view of working conditions and environmental issues since a highly toxic organic solvent such as a phenol compound or chlorobenzene is used in the removing treatment, and in addition, they are disadvantageously corrosive for the conductive metallic film or the like on the substrate. Meanwhile, organic amine-based remover solutions have lower toxicity as compared to organic sulfonic acid-based remover solutions, therefore they do not require troublesome treatment for disposal of the waste solution, they exhibit good removing performance for degenerate films resulting from dry etching, ashing, ion implantation and other treatments, and in addition, they have superior anticorrosive effects for electrically conducting metal layer such as Al, Cu, Al alloy and the like which is formed on the substrate. Organic amine-based remover solutions, however, also have some drawbacks. For example, they cannot exhibit sufficient removing performance for resist films which have degenerated to the extent of possessing inorganic properties. Further, since the temperature for such removing treatment is relatively high as 60 to 130° C., combustible organic compounds in such a remover solution may volatilize and be ignited, and therefore, expensive facilities are necessary for disaster prevention. As a result, the manufacturing cost becomes high. On the other hand, although hydrofluoric acid-based remover solutions exhibit superior removing performance for the aforementioned films which have degenerated to the extent of possessing inorganic properties, they are inferior regarding safety of the human body, namely, they are not easily handled. In addition, since a composition containing such a remover solution becomes acidic, it readily corrodes peripheral units such as a chemical solution-supplying unit which connects a removal treatment bath to a container containing the remover solution, and therefore, further complex processes are required for exhaust disposal and waste solution disposal.

Aiming at solving the above-described problems, the inventors have already proposed a remover solution in which the principal ingredient is a salt derived from hydrofluoric acid and a metal-free base (hereinafter, referred to as hydrofluoric acid-based remover solution). This hydrofluoric acid-based remover solution can achieve a low-temperature short-time removing treatment, can prevent metallic thin-films on the substrate and peripheral units from corroding, and can easily be treated for exhaust disposal or waste solution disposal due to its low toxicity. Such a remover solution, however, corrodes metallic thin-films such as Ti, Al, Al—Si or Al—Si—Cu films in a case where a washing process using pure water after the removing treatment requires a time period of above approximately 10 min. The inventors considered that such corrosion may be attributed to generation of hydrofluoric acid from the hydrofluoric acid salt due to contact with water, and conducted research on rinsing treatments in which various organic solvents such as methanol, ethanol, isopropyl alcohol and acetone were used and examined instead of pure water. These organic solvents were, however, found to be unsuitable since the hydrofluoric acid salt undesirably recrystallizes on the substrate.

Accordingly, an object of the present invention is to provide a substrate treatment method using a specific lithographic rinsing solution which does not corrode metallic thin-films on the substrate.

Further, another object of the present invention is to provide a substrate treatment method in which disposal of a substrate-rinsing solution after use can be carried out with a reduced volume of labor.

SUMMARY OF THE INVENTION

Given the above-described circumstances, the Inventors conducted further research, found that metallic thin-films can be prevented from corroding and the volume of labor for disposal of an used pure-water washing solution after the rinsing treatment can be reduced by using a composition containing water and a water-soluble organic solvent as a rinsing solution used for rinsing the substrate after removing treatment using a hydrofluoric acid-based remover solution, and have thus accomplished the present invention.

Specifically, the present invention provides a substrate treatment method to be performed after the steps of forming a desired resist pattern on a substrate and etching thereof, wherein said method comprises steps of:

(I) removing the resist pattern on the substrate using a remover solution principally containing a salt derived from hydrofluoric acid and a metal-free base;

(II) rinsing said substrate with a lithographic rinsing solution containing a water-soluble organic solvent and water; and (III) washing said substrate with water.

Further, the present invention provides a substrate treatment method to be performed after the steps of forming a desired resist pattern on a substrate and etching and ashing thereof, said method comprising steps of:

(I) removing the degenerated resist pattern on the substrate after ashing using a remover solution principally containing a salt derived from hydrofluoric acid and a metal-free base;

(II) rinsing said substrate with a lithographic rinsing solution containing a water-soluble organic solvent and water; and (III) washing said substrate with water.

DETAILED DESCRIPTION OF THE INVENTION

The lithographic rinsing solution used in the present invention is to rinse a substrate for a semiconductor device or a liquid-crystal panel device after the substrate has been treated with a hydrofluoric acid-based remover solution, and is a composition containing a water-soluble organic solvent and water. Examples of such water-soluble organic solvents include monohydric alcohols such as methyl alcohol, ethyl alcohol, and isopropyl alcohol; sulfoxides such as dimethyl sulfoxide; sulfones such as dimethylsulfone, diethylsulfone, bis(2-hydroxyethyl)sulfone, and tetramethylenesulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; lactones such as γ-butylolactone, and δ-valerolactone; and polyhydric alcohols and derivatives thereof such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, and diethylene glycol monobutyl ether. Among these, monohydric alcohol such as methyl alcohol, ethyl alcohol, isopropyl alcohol, aprotic polar solvents such as dimethyl sulfoxide, N,N-dimethylformamide, N,N-dimethylacetamide, N-methyl-2-pyrrolidone and 1,3-dimethyl-2-imidazolidinone, polyhydric alcohols such as ethylene glycol, polyhydric alcohol derivatives such as diethylene glycol monobutyl ether are preferred, and particularly, monohydric alcohols such as methyl alcohol, ethyl alcohol, and isopropyl alcohol are more preferred since rinsing solutions prepared from them can be put into disposal at low cost without any complex treatment after the solutions are used.

In the lithographic rinsing solution used in the present invention, the content of the water-soluble organic solvent is preferably 20 to 90% by weight, and more preferably, 40 to 80% by weight; and the content of water is preferably 10 to 80% by weight, and more preferably 20 to 60% by weight. If the content of the water-soluble organic solvent exceeds the above-described range, the hydrofluoric acid salt readily recrystallize on a substrate. On the other hand, a content below the above-described range results in corrosion of metallic thin-films.

Additionally, an anticorrosive may be contained in the lithographic rinsing solution used in the present invention. Examples of anticorrosives include aromatic hydroxyl compounds, acetylene alcohols, carboxyl group-containing organic compounds and anhydrides thereof, triazoles, and saccharides.

Typical examples of aromatic hydroxyl compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, and 3,5-dihydroxybenzoic acid. Among these, pyrocatechol is preferred.

Typical examples of acetylene alcohols include 2-butyne-1,4-diol, 3,5-dimethyl-1-hexyne-3-ol, 2-methyl-3-butyne-2-ol, 3-methyl-1-pentyne-3-ol, 3,6-dimethyl-4-octyne-3,6-diol, 2,4,7,9-tetramethyl-5-decyne-4,7-diol, and 2,5-dimethyl-3-hexyne-2,5-diol. Among these, 2-butyne-1,4-diol is preferred.

Examples of carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride, and salicylic acid. Preferred carboxyl group-containing organic compounds are formic acid, phthalic acid, benzoic acid, phthalic anhydride, and salicylic acid, and particularly preferred are phthalic acid, phthalic anhydride, and salicylic acid.

Examples of triazoles include benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole. Among these, benzotriazole is preferred.

Typical examples of saccharides include D-sorbitol, arabitol, mannitol, sucrose, and starch. Among these, D-sorbitol is preferred.

Any of the above-listed compounds can be used solely or in combination with others as an anticorrosive.

In a case where an anticorrosive is added, the lithographic rinsing solution used in the present invention may preferably contain 55 to 85% by weight of a water-soluble organic solvent, 10 to 40% by weight of water, and 0.5 to 15% by weight of the anticorrosive. When the content of the anticorrosive falls within such a range, corrosion of metallic thin-films can be further desirably prevented.

The aforementioned hydrofluoric acid-based remover solution principally contains a salt [ingredient (a)] derived from hydrofluoric acid and a metal-free base. In other wards, the hydrofluoric acid-based remover solution is not especially limited so long as it principally contains such an ingredient (a). A neutral remover solution for resists is preferred, which contains a water-soluble organic solvent [ingredient (b)] and water [ingredient (c)] in addition to the ingredient (a), and has a pH value falling within a range of 5 to 8.

The aforementioned metal-free base is a base which contains no metallic element within its molecular structure, and examples of such bases include organic amines such as hydroxylamines, primary, secondary or tertiary aliphatic amines, alicyclic amines, aromatic amines, and heterocyclic amines; aqueous ammonia; and quaternary lower alkyl ammonium bases.

Typically, examples of hydroxylamines include hydroxylamine and N,N-diethylhydroxylamine; examples of primary aliphatic amines include monoethanolamine, ethylenediamine, and 2-(2-aminoethylamino)ethanol; examples of secondary aliphatic amines include diethanolamine, dipropylamine, and 2-ethylaminoethanol; examples of tertiary aliphatic amines include dimethylaminoethanol, and ethyldiethanolamine; examples of alicyclic amines include cyclohexylamine, and dicyclohexylamine; examples of aromatic amines include benzylamine, dibenzylamine, and N-methylbenzylamine; and examples of heterocyclic amines include pyrrole, pyrrolidine, pyrrolidone, pyridine, morpholine, pyrazine, piperidine, N-hydroxyethyl piperidine, oxazole, and thiazole. Further, typical examples of quaternary lower alkyl ammonium bases include tetramethylammonium hydroxide, and trimethyl(2-hydroxyethyl)ammonium hydroxide (choline). Among the above-listed compounds, aqueous ammonia, monoethanol amine and tetramethylammonium hydroxide are preferred since they are easily obtainable and superior in safety.

The salt derived from hydrofluoric acid and the above-described metal-free base can be prepared by adding a metal-free base to a commercially-available hydrofluoric acid solution of 50 to 60% hydrofluoric acid concentration such that the pH is adjusted to 5 to 8. Needless to say, commercially-available ammonium fluoride can be used as such a salt.

In order to substantially neutralize the aforementioned hydrofluoric acid-based remover solution to a pH of 5 to 8, the ingredient (a) should be prepared so as to be neutral. The procedure of preparing the ingredient (a) can, however, not generally be specified since the quantity of the metal-free base added to hydrofluoric acid for neutralization depends on the type of the metal-free base. For example, in a case using aqueous ammonia as the base, an ingredient (a) having a desired pH value can be obtained by mixing equal volumes of hydrofluoric acid solution and aqueous ammonia which have the same molar concentration. Further, in a case using ethanolamine, an ingredient (a) having a desired pH value can be obtained by mixing 1,000 ml of a 1 mole/liter hydrofluoric acid solution with 1 mole of monoethanolamine. By adjusting the pH of the ingredient (a) to within the above-described range, deterioration in removing performance of the remover solution against degenerate films will not occur, corrosion of metallic films on the substrate or of peripheral units such as a chemical solution supplying unit can be prevented, and the remover solution can be safely handled. Further, since the content of hydrogen fluoride is small, such a remover solution does not require complicated treatment for exhaust disposal and waste solution disposal, which is required for prevention of disaster due to generation of hydrogen fluoride gas.

As the ingredient (b) of the above-described hydrofluoric acid-based remover solution, the same water-soluble organic solvents as those in the aforementioned lithographic rinsing solution can be used.

Among the water-soluble organic solvents listed above, dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether are preferred since they exhibit superior removing performance against degenerate films. Dimethyl sulfoxide is particularly preferred. Further, if a water-soluble organic solvent containing at least 10% by weight of ethylene glycol is used as the ingredient (b), the remover solution can exhibit a high anticorrosive effect for metallic thin-films when used for removing a hole-shaped resist pattern. In this case, since such an anticorrosive effect can be improved in proportion to the content of ethylene glycol, the ingredient (b) may be ethylene glycol alone, or may be a mixture of equal weights of ethylene glycol and dimethyl sulfoxide.

In the hydrofluoric acid-based remover solution, the ingredients (a), (b) and (c) may preferably be contained at 0.2 to 10% by weight, 30 to 90% by weight and 5 to 50% by weight, respectively, and more preferably, 0.5 to 10% by weight, 40 to 90% by weight and 20 to 40% by weight, respectively. With the ingredients satisfying these quantitative ranges, the removing performance of the remover solution against degenerate films or at room temperature can be improved, and anticorrosive effect of the remover solution against the metallic thin films on the substrate can also be improved. In particular, when the substrate to be subjected to the removing treatment is an easily-corrodible substrate metalized with Al, Al—Si, Al—Si—Cu or the like, these quantitative ranges should essentially be satisfied. With an ingredient (a) quantity below the above-described range, the removing performance of the remover solution against degenerate films will deteriorate, while the substrate will readily be corroded with a quantity exceeding the range.

Additionally, the hydrofluoric acid-based remover solution may contain an anticorrosive as an ingredient (d). The compounds listed as anticorrosives for the aforementioned lithographic rinsing solution can be used as the ingredient (d). The addition of the ingredient (d) gives the remover solution a further improved anticorrosive property without deterioration in the removing performance against degenerated films on a substrate metalized with Al, Al—Si, Al—Si—Cu or the like.

In the hydrofluoric acid-based remover solution containing the ingredient (d), the ingredients (a), (b), (c) and (d) may preferably be contained at 0.2 to 10% by weight, 30 to 80% by weight, 5 to 50% by weight, and 0.5 to 40% by weight, respectively, and more preferably, 0.5 to 10% by weight, 40 to 70% by weight, 20 to 40% by weight and 1 to 30% by weight, respectively. Deviation of any ingredient from the above-described quantitative range leads to deterioration in the removing performance against degenerate films and in the anticorrosive properties.

As described above, the substrate treatment method of the present invention, which is to be performed after the steps of forming a desired resist pattern on a substrate and etching thereof, comprises steps of:

(I) removing the resist pattern using a remover solution principally containing a salt of hydrofluoric acid and a metal-free base;

(II) rinsing said substrate with a lithographic rinsing solution containing a water-soluble organic solvent and water; and (III) washing said substrate with water. The preceding step of forming a resist pattern may be carried out according to an ordinary pattern-forming method. For example, a typical pattern-forming method comprises the following steps.

A positive or negative resist composition is applied by a spin coating method, a roll coater method, a bar coater method or the like to a substrate such as a silicon wafer or a glass substrate used for a semiconductor device or a liquid-crystal panel device;

on the thus formed resist layer, a latent image is formed by irradiation or scanning with ultraviolet rays, far ultraviolet rays such as from an excimer laser, an electron beam, an X ray or other radial rays through a mask pattern; and the latent image is then developed with an alkaline solution, and thus a resist pattern is formed.

Next, the substrate is dry etched so that the resist pattern becomes a mask and subsequently the conventional ashing treatment may be performed. The present invention may also be applied to the substrate subjected to a sequence of the treatments of the resist coating, irradiation, development, etching and ashing.

The removing treatment may be performed, for example, according to a dipping method at room temperature for 1 to 20 min. Also, the rinsing step may be performed according to a dipping method or the like at room temperature for 3 to 20 min.

Conventionally, the washing step using water is performed just after the removing treatment step without the rinsing step. In this case, the substrate should be repeatedly washed with a large volume of water. Accordingly, fluorine ions and fluoride compounds increasingly accumulate in the washing bath, and a complicated process is required for disposal of the waste solution. In contrast, the substrate treatment method of the present invention is free from residual fluorine ions and fluoride compounds in the washing bath since a rinsing step precedes the washing step. Due to this, the labor and cost for disposal of the waste solution in the washing bath can be saved, and in addition, the removing treatment, the rinsing step and the washing step can be performed continuously and efficiently.

EXAMPLES

The present invention will be further illustrated in detail with examples below.

Examples 1 to 6

A plurality of silicon wafers were prepared, on each of which an Al—Si—Cu film of approximately 1.0 μm thickness was deposited. THMR-ip3300 (manufactured by Tokyo Ohka Kogyo Co., Ltd.) comprising a novolak resin and a naphthoquinone diazide compound serving as a positive photoresist was then applied to each wafer by spinner coating, and pre-baked at 90° C. for 90 sec. to form a resist layer of 2.0 μm thickness. This resist layer was then subjected to exposure through a mask pattern using NSR-2005i10D (manufactured by Nikon Corporation), and subjected to development in a solution containing 2.38% by weight of tetramethylammonium hydroxide to form a resist pattern. Subsequently, the resultant was post-baked at 120° C. for 90 sec.

Next, the resulting silicon wafer, which was provided with the resist pattern in addition to the Al—Si—Cu deposition film of approximately 1.0 μm thickness, was then etched with an etchant mixture gas comprising chlorine and boron trichloride under a pressure of 5 mm Torr at a stage temperature of 20° C. for 168 sec. using an etching apparatus TSS-6000 (manufactured by Tokyo Ohka Kogyo Co., Ltd.). The resultant was then subjected to an after-corrosion treatment under a pressure of 20 mm Torr at a stage temperature of 20° C. for 30 sec. using a mixture gas comprising oxygen and trifluoromethane. After this, an ashing treatment with oxygen was carried out under a pressure of 0.3 mm Torr at a stage temperature of 60° C. for 150 sec. using an ashing apparatus TCA-2400 (manufactured by Tokyo Ohka Kogyo Co., Ltd.).

The thus treated silicon wafers were then subjected to a removing treatment in a remover solution at 23° C. for 5 min., said remover solution comprising 1.0% by weight of ammonium fluoride, 69.0% by weight of dimethyl sulfoxide, and 30% by weight of water. After this, each wafer was rinsed with a rinsing solution having a composition shown in Table 1, washed with pure water, and the degree of substrate corrosion was examined. The results are shown in Table 1.

Comparative Example 1

An examination for substrate corrosion was performed similar to the aforementioned examples except that the rinsing solution used herein contained water alone. The results are shown in Table 1.

TABLE 1

| | Composition of Rinsing Solution (parts by weight) | Degree of Corrosion after Dipping in Water at 23° C. for 20 min.* |
|---|---|---|
| Example 1 | Methanol:Water (50:50) | o |
| Example 2 | Methanol:Water (80:20) | o |
| Example 3 | Ethanol:Water (70:30) | o |
| Example 4 | Ethanol:Water (30:70) | o |
| Example 5 | Isopropyl Alcohol:Water (70:30) | o |
| Example 6 | Isopropyl Alcohol:Water (50:50) | o |
| Comparative Example 1 | Water | x |

*o: No Corrosion
X : Corroded

In the substrate treatment method of the present invention, an easily corrodible metallic thin-film such as an Al, Al—Si or Al—Si—Cu thin-film was not corroded since a specific lithographic-use rinsing solution was used. Further, according to the use of such a lithographic rinsing solution, only an extremely small quantity of fluorine ions were present in the pure water after being used in the washing step succeeding the rinsing step. Accordingly, no special process is required for disposal of the waste solution used in the washing step, and therefore, the removing treatment, the rinsing step and the washing step can be performed continuously and efficiently.

While the invention has been described in detail and with reference to specific embodiments thereof, it will be apparent to one of ordinary skill in the art that various changes and modifications can be made therein without departing from the spirit and scope thereof.

What is claimed is:

1. A substrate treatment method to be performed after the steps of forming a resist pattern on a substrate and etching thereof, said method comprising the steps of:

(I) removing the resist pattern on the substrate using a remover solution principally containing a salt derived from hydrofluoric acid and a metal-free base;

(II) rinsing said substrate with a lithographic rinsing solution containing a water-soluble organic solvent and water, the rinsing solution containing 20 to 90% by weight of a water-soluble organic solvent and 10 to 80% by weight of water; and (III) washing said substrate with water.

2. The substrate treatment method according to claim 1, wherein said water-soluble organic solvent comprises at least one compound selected from the group consisting of alcohols, glycol monoethers, and aprotic polar solvents.

3. The substrate treatment method according to claim 2, wherein said alcohols include methyl alcohol, ethyl alcohol, isopropyl alcohol, and ethylene glycol.

4. The substrate treatment method according to claim 2, wherein said glycol monoethers include diethylene glycol monobutyl ether.

5. The substrate treatment method according to claim 2, wherein said aprotic polar solvents include dimethyl sulfoxide, N,N-dimethylformamide, N,N-dimethylacetamide, N-methyl-2-pyrrolidone, and 1,3-dimethyl-2-imidazolidinone.

6. The substrate treatment method according to claim 1, wherein said remover solution principally containing a salt derived from hydrofluoric acid and a metal-free base comprises:

(a) a salt derived from hydrofluoric acid and a metal-free base;

(b) at least one compound selected from the group consisting of dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether; and (c) water, and wherein the pH value of said remover solution falls within a range of 5 to 8.

7. The substrate treatment method according to claim 1, wherein said remover solution principally containing a salt derived from hydrofluoric acid and a metal-free base is a remover solution for resists which comprises 0.2 to 10% by weight of ammonium fluoride, 30 to 90% by weight of dimethyl sulfoxide, and 5 to 50% by weight of water.

8. The substrate treatment method according to claim 1, wherein said rinsing solution further contains an anticorrosive.

9. The substrate treatment method according to claim 8, wherein said anticorrosive comprises at least one compound selected from the group consisting of catechol, 2-butyne-1,4-diol, benzotriazole, and D-sorbitol.

10. The substrate treatment method according to claim 8, wherein said rinsing solution contains 55 to 85% by weight of a water-soluble organic solvent, 10 to 40% by weight of water, and 0.5 to 15% by weight of an anticorrosive.

11. A substrate treatment method to be performed after the steps of forming a resist pattern on a substrate and etching and ashing thereof, the ashing forming a degenerated resisit pattern on the substrate, said method comprising the steps of:

(I) removing the degenrated resist pattern on the substrate using a remover solution principally containing a salt derived from hydrofluoric acid and a metal-free base;

(II) rinsing said substrate with a lithographic rinsing solution containing a water-soluble orgabic solvent and water, the rinsing solution containing 20 to 90% by weight of a water-soluble organic solvent and 10 to 80% by weight of water; and (III) washing said substrate with water.

12. The substrate treatment method according to claim 11, wherein said water-soluble organic solvent comprises at least one compound selected from the group consisting of alcohols, glycol monoethers, and aprotic polar solvents.

13. The substrate treatment method according to claim 12, wherein said alcohols include methyl alcohol, ethyl alcohol, isopropyl alcohol, and ethylene glycol.

14. The substrate treatment method according to claim 12, wherein said glycol monoethers include diethylene glycol monobutyl ether.

15. The substrate treatment method according to claim 12, wherein said aprotic polar solvents include dimethyl sulfoxide, N,N-dimethylformamide, N,N-dimethylacetamide, N-methyl-2-pyrrolidone, and 1,3-dimethyl-2-imidazolidinone.

16. The substrate treatment method according to claim 11, wherein said remover solution principally containing a salt derived from hydrofluoric acid and a metal-free base comprises:

(a) a salt derived from hydrofluoric acid and a metal-free base;

(b) at least one compound selected from the group consisting of dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether; and (c) water, and wherein the pH value of said remover solution falls within a range of 5 to 8.

17. The substrate treatment method according to claim 11, wherein said remover solution principally containing a salt derived from hydrofluoric acid and a metal-free base is a remover solution for resists which comprises 0.2 to 10% by weight of ammonium fluoride, 30 to 90% by weight of dimethyl sulfoxide, and 5 to 50% by weight of water.

18. The substrate treatment method according to claim 11, wherein said rinsing solution further contains an anticorrosive.

19. The substrate treatment method according to claim 18, wherein said anticorrosive comprises at least one compound selected from the group consisting of catechol, 2-butyne-1,4-diol, benzotriazole, and D-sorbitol.

20. The substrate treatment method according to claim 18, wherein said rinsing solution contains 55 to 85% by weight of a water-soluble organic solvent, 10 to 40% by weight of water, and 0.5 to 15% by weight of an anticorrosive.

* * * * *